(12) United States Patent
Ker et al.

(10) Patent No.: US 6,437,407 B1
(45) Date of Patent: Aug. 20, 2002

(54) CHARGED DEVICE MODEL ELECTROSTATIC DISCHARGE PROTECTION FOR INTEGRATED CIRCUITS

(75) Inventors: Ming-Dou Ker, Hsinchu; Chyh-Yih Chang, Hsinchuang, both of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/706,807

(22) Filed: Nov. 7, 2000

(51) Int. Cl.[7] .............................................. H01L 23/62
(52) U.S. Cl. ......................... 257/357; 361/56; 361/111
(58) Field of Search ................................ 257/355, 357, 257/360; 327/325; 361/56, 111

(56) References Cited

U.S. PATENT DOCUMENTS

| | | | |
|---|---|---|---|
| 5,729,419 A | 3/1998 | Lien | 361/111 |
| 5,901,022 A | 5/1999 | Ker | 361/56 |
| 5,910,874 A | 6/1999 | Iniewski et al. | 361/56 |
| 5,945,713 A | 8/1999 | Voldman | 257/355 |
| 6,025,746 A | 2/2000 | So | 327/325 |
| 6,128,171 A | * 10/2000 | Iniewski et al. | 361/56 |

OTHER PUBLICATIONS

S. M. Sze, VLSI Technology, second Edition, pp. Section 11.4.*
Norman G. Einspruch, VLSI Handbook, 1985, pp. 100–103.*

* cited by examiner

Primary Examiner—Michael J. Sherry
Assistant Examiner—Asok Kumar Sarkar
(74) Attorney, Agent, or Firm—Intellectual Property Solutions, P.L.L.C.

(57) ABSTRACT

A charged-device model (CDM) electrostatic discharge (ESD) protection for complementary metal oxide semiconductor (CMOS) integrated circuits such as input/output (I/O) circuits. A CDM ESD clamp device is disposed on an output buffer or an input stage of the CMOS circuit in order to clamp the CDM ESD overstress voltage across the gate oxide during a CDM ESD event. When applied to I/O circuits, a bi-directional diode string with multiple diodes is used in conjunction with the CDM ESD clamp device. During the CDM ESD event, CDM charges (CDM Q) originally stored in the common substrate are discharged through the desired CDM ESD clamp device so as to protect all functional devices in the input, output or I/O circuits, and effectively improve the CDM ESD level in integrated circuit (IC) products.

20 Claims, 16 Drawing Sheets

CHARGED DEVICE MODEL ELECTROSTATIC DISCHARGE PROTECTION FOR INTEGRATED CIRCUITS

BACKGROUND OF THE INVENTION

1. Field of the Invention

The present invention generally relates to a charged device model (CDM) electrostatic discharge (ESD) protection for integrated circuits (ICs). More specifically, the present invention relates to a CDM ESD protection circuit for use in a metal oxide semiconductor (MOS) circuit or input/output (I/O) circuit.

2. Description of the Related Art

U.S. Pat. No. 5,901,022 to Ker (hereinafter '022 patent) and U.S. Pat. No. 5,729,419 to Lien (hereinafter '419 patent) disclose two ways of providing CDM ESD protection to CMOS ICs. FIG.1 shows one type of conventional ESD protection for CDM ESD event as taught by '022 patent, and FIG. 2 shows another type of conventional ESD protection for CDM ESD event as taught by the '419 patent. In FIG. 1, there is an inductor 102 placed between an input pad 104 and a gate oxide of the first input stage 106 to limit the CDM ESD current discharging through the gate oxide of the first input stage 106. In FIG.2, the CDM ESD clamps 310 and 311 are added between an output pad 301 and output nodes 321 and 322 of the pre-driver circuits 306 and 307 to clamp the overstress voltage across the gate oxide of the output transistors 302 and 303.

The circuit diagram to realize the conventional ESD protection for CDM ESD event shown in FIG. 2 is illustrated in FIG.3, noting that the output nodes 321 and 322 of the pre-driver inverters 306 and 307 are connected to the CDM clamps 310 and 311. The CDM ESD current discharging paths during the CDM ESD event in this conventional art are schematically drawn in FIG.4 by dashed lines with arrows.

Generally, the common substrate of a CMOS chip has a thickness of 500 to 600 $\mu$m, which is much thicker than that of the N-well or P-well regions in general CMOS technologies. Accordingly, the CDM charges are mainly stored in among the large-volume common p-type substrate. During a CDM ESD event, the output pad is grounded, and the CDM charges are discharged through the devices of the CMOS circuits to the grounded output pad. The CDM ESD discharging current has a very fast transition. For a typical 1000 V CDM event, the CDM discharging current can be as high as 15 amps (A) with a rise time of 0.5 to 1 nanoseconds (ns). Under such fast CDM transition, the CDM charges are often discharged through the path that has the lowest impedance along the CMOS circuits. In FIG. 4, the CDM charges (hereinafter CDM Q) which are originally stored in the substrate, is schematically illustrated in the circuit at the bulk (substrate) of Mnd2 of the pre-driver inverter. When the output pad is grounded, the CDM Q is discharged through three possible current paths, marked as ICDM_1, ICDM_2 and ICDM_3 in FIG. 4.

As discussed in the '419 patent, the CDM discharging current path should be the ICDM_2 in FIG.4. Along the path of ICDM_2, the CDM current goes from the p-type substrate into the bulk of Mnd2, and then through the parasitic drain-to-bulk diode (Dn2) of Mnd2 device to the drain of Mnd2 (the output node of pre-driver inverter). Then, the CDM current is discharged through the added CDM clamp to the grounded output pad. However, if the CDM Q stored in the common substrate have a negative polarity, then the diode Dn2 has to be broken down to bypass the CDM Q from the p-type substrate to the output node of the pre-driver inverter. In this instance, the diode Dn2 cannot be broken down to conduct the fast CDM Q in a time period of approximately 1 ns. Moreover, the breakdown voltage across the diode Dn2 and the voltage drop across the added CDM clamp cause a high voltage drop from the common p-type substrate to the grounded output pad, which in turn cause the path of ICDM_2 in FIG.4 to have a high impedance due to the CDM fast-transition current.

The path of ICDM_3 in FIG. 4 goes from the p-type substrate to the N-well of PMOS (Mpd2), through Dnw2 or through in turn Dn2 and Dp2, and then to the output PMOS Mpo1 through the VDD power line. If the CDM Q stored in the p-type substrate have a negative polarity, then the diode Dnw2 (n-well/p-type substrate junction), which has a high breakdown voltage of 20~30 V, has to be broken down to conduct the CDM Q into the n-well region of the PMOS Mpd2. With such high n-well p-type substrate breakdown voltage, the path of ICDM_3 equivalently has a high impedance for the CDM Q. Therefore, the CDM Q is seldom discharged through the this path ICDM_3.

Because the diode breakdown of the diode Dn2 or Dnw2 causes a delay in time and a high-impedance response along the path, negative CDM Q stored in the p-type substrate cannot be efficiently discharges through the paths of ICDM_2 or ICDM_3. The negative CDM Q stored in the p-type substrate are therefore discharged through the path of ICDM_1 as shown in FIG. 4. The discharging path of ICDM_1 is formed directly from the p-type substrate through the output NMOS Mno1 to the grounded output pad, even if there is a CDM clamp added between the output node of pre-driver inverter and output pad. This means that the added CDM clamp in FIG. 4 has not provided the desired CDM ESD discharging path to protect the output NMOS transistors. This is a defective design that does not sufficiently protect the output buffer against the CDM ESD events.

To more clearly described the CDM discharging path in FIG.4, a cross-sectional view of the partial devices (Mno1, Mnd2 and Mpd2) in the circuits shown in FIG.4 is illustrated in FIG. 5. As seen in FIG.5, the CDM clamp is connected from the drain of Mpd2 and Mnd2 (the output node of the pre-driver inverter) to the output pad. The parasitic diodes (Dn2 in Mnd2, Dp2 in Mpd2, Dnw2 in Mpd2, and Dn1 in Mno1) are indicated in FIG.5 by the symbol of diode. The case of negative CDM Q stored in the common p-type substrate is drawn in FIG. 6 to clearly describe the real CDM current discharging path in the output circuits. The possible CDM ESD discharging paths are marked as ICDM_1, ICDM_2, and ICDM_3, which are corresponding to the paths as shown in FIG. 4. In FIG. 6, the fastest discharging path to discharge the negative CDM Q stored in the common p-type substrate is the path ICDM_1. The discharging paths of ICDM_2 and ICDM_3 are also drawn in FIG. 6, to physically show these inefficient discharging paths. Thus, the added CDM clamp in the '410 patent does not improve the CDM ESD level of the output buffer. The CDM Q is still mainly discharged through the output buffer itself.

Although the CDM ESD design in the conventional art is defective and inefficient, it has shown at least that the CDM ESD protection has been a serious concern in the deep sub-micron CMOS IC with much thinner gate oxide.

SUMMARY OF THE INVENTION

Accordingly, an object of the present invention is provided a more efficient CDM ESD protection circuit to output circuits, input circuits, high/low voltage tolerant I/O circuits, and isolated N-well and P-well biased CMOS circuits to which one or more CDM clamps are directly connected to one or more bulks of the MOS transistors.

It is another object of the present invention to provide, in addition to the CDM clamps, one or more bi-directional diode strings between the power lines to improve the CDM ESD level of the integrated circuit.

In accordance with the present invention, an output CDM ESD protection circuit is provided for use in an integrated circuit. In particular, the output circuit includes an output pad, VDD and VSS power lines, one or more MOS transistors disposed between the output pad and the VDD or VSS power line, one or more MOS circuits with CMOS transistors disposed between the VDD and VSS power lines, and one or more CDM ESD protection circuits disposed between the output pad and the MOS circuits, wherein the drains of the CMOS transistors are directly coupled to the respective gates of the MOS transistors, and the CDM ESD protection circuits are directly coupled to the respective bulks of the CMOS transistors.

In accordance with another aspect of the present invention, an input CDM ESD protection circuit is provided for the integrated circuit in which the input circuit includes an input pad and one or more bi-directional diode strings disposed between power lines, wherein one or more CDM ESD protection circuits are disposed between the input pad and MOS transistors, and directly coupled to the respective bulks of the MOS transistors.

In accordance with yet another aspect of the present invention, an analog circuit with different input stage is provided for the integrated circuit. In particular, the analog circuit includes an input pad, a HBM/MM ESD protection circuit coupled to the input pad and disposed between VDD_I/O and VSS_I/O power lines, a pair of bi-directional diode strings respectively disposed between the VDD_I/O power line and either VDDA or VSSA power line, CMOS transistors disposed between the VDDA and VSSA power lines, and a CDM ESD protection circuit disposed between the HBM/MM ESD protection circuit and one of the CMOS transistors, wherein the CDM ESD protection circuit is directly coupled to a bulk of one of the CMOS transistors.

In accordance with still another aspect of the present invention, a high-voltage tolerant I/O circuit is provided for use in the integrated circuit. The I/O circuit includes an I/O pad, CMOS transistors disposed between power lines, and a CDM ESD protection circuit disposed between the I/O pad and the CMOS transistors, wherein the CDM ESD protection circuit is directly coupled to a bulk of one of the CMOS transistors.

Related aspects and advantages of the invention will become apparent and more readily appreciated from the following detailed description of the invention, taken in conjunction with the accompanying drawings.

DETAILED DESCRIPTION OF THE PREFERRED EMBODIMENTS

The present invention will now be described by way of preferred embodiments with references to the accompanying drawings. Like numerals refer to corresponding parts of various drawings.

Figure 1:
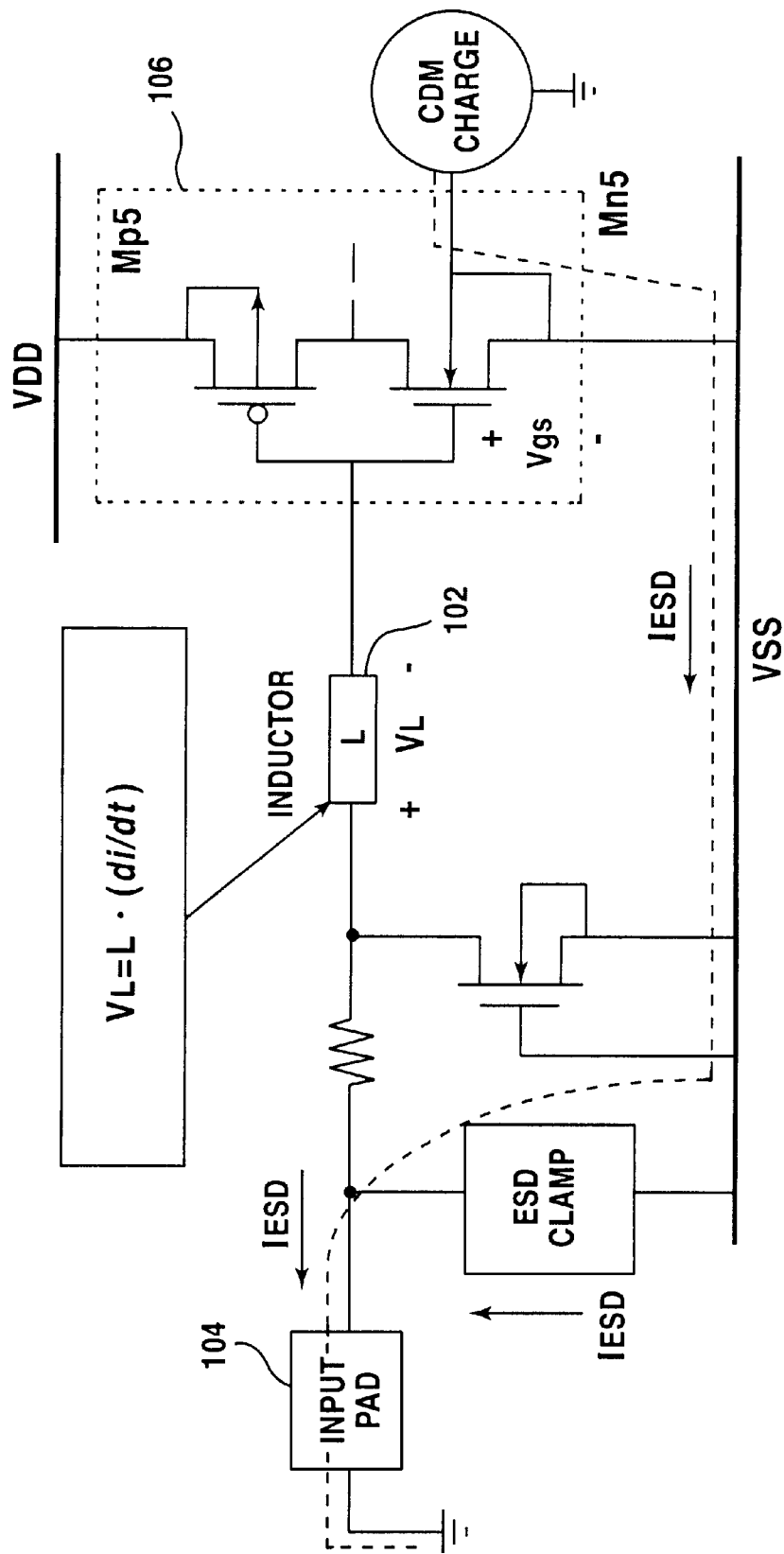
FIG. 1 is a circuit diagram of a conventional CDM ESD protection circuit as disclosed in the '022 patent.
Figure 2:
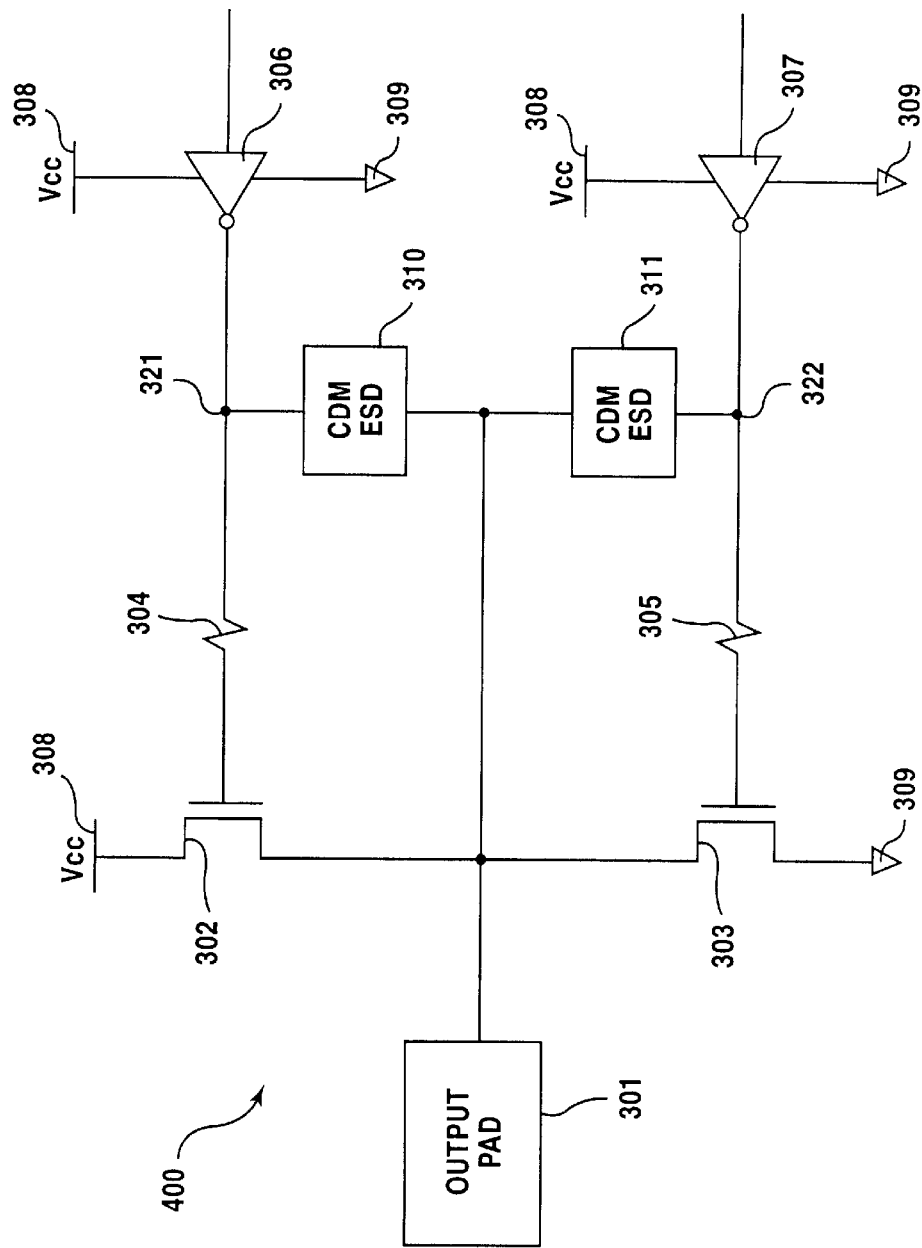
FIG. 2 is a circuit diagram of another conventional CDM ESD protection circuit as disclosed the '419 patent.
Figure 3:
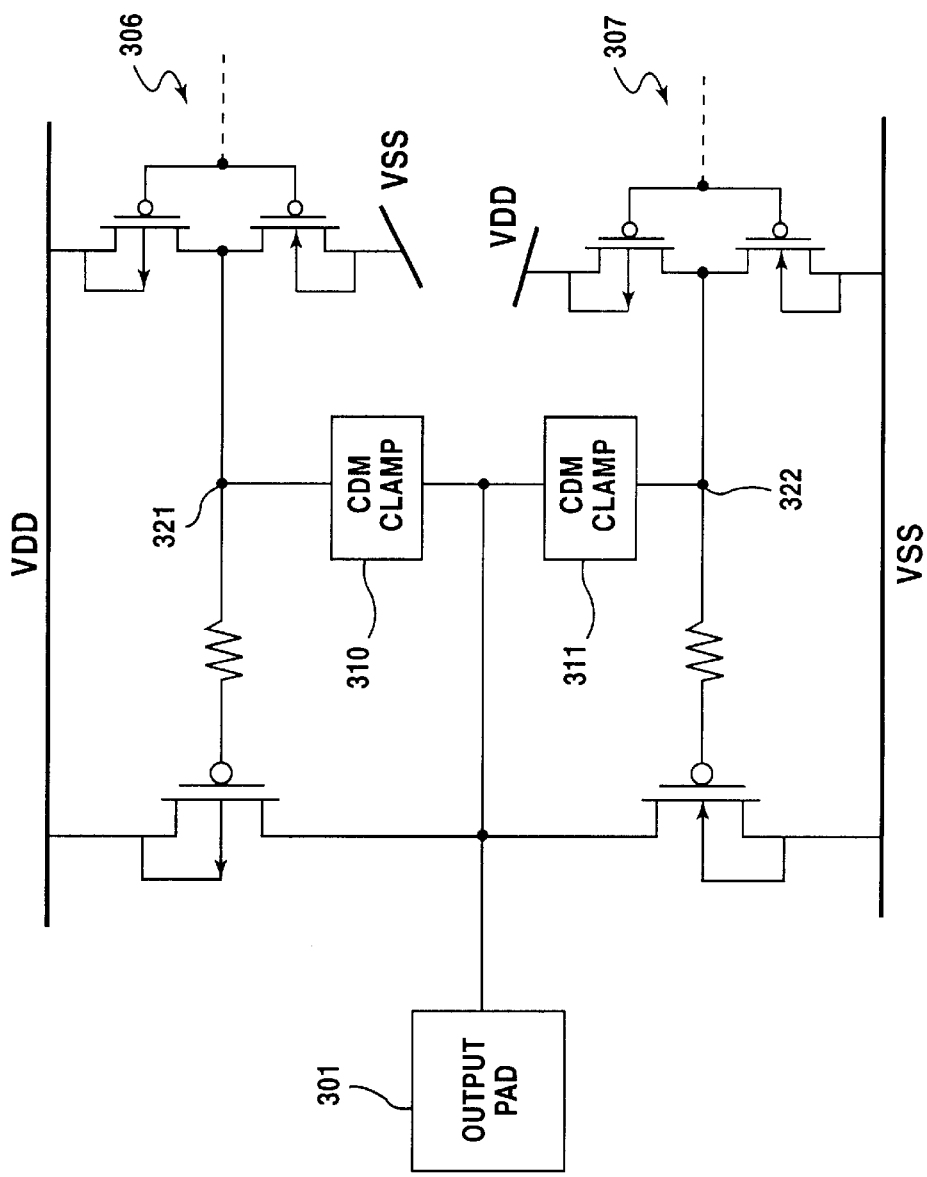
FIG. 3 is a realized circuit diagram of the conventional CDM ESD protection circuit of FIG. 2.
Figure 4:
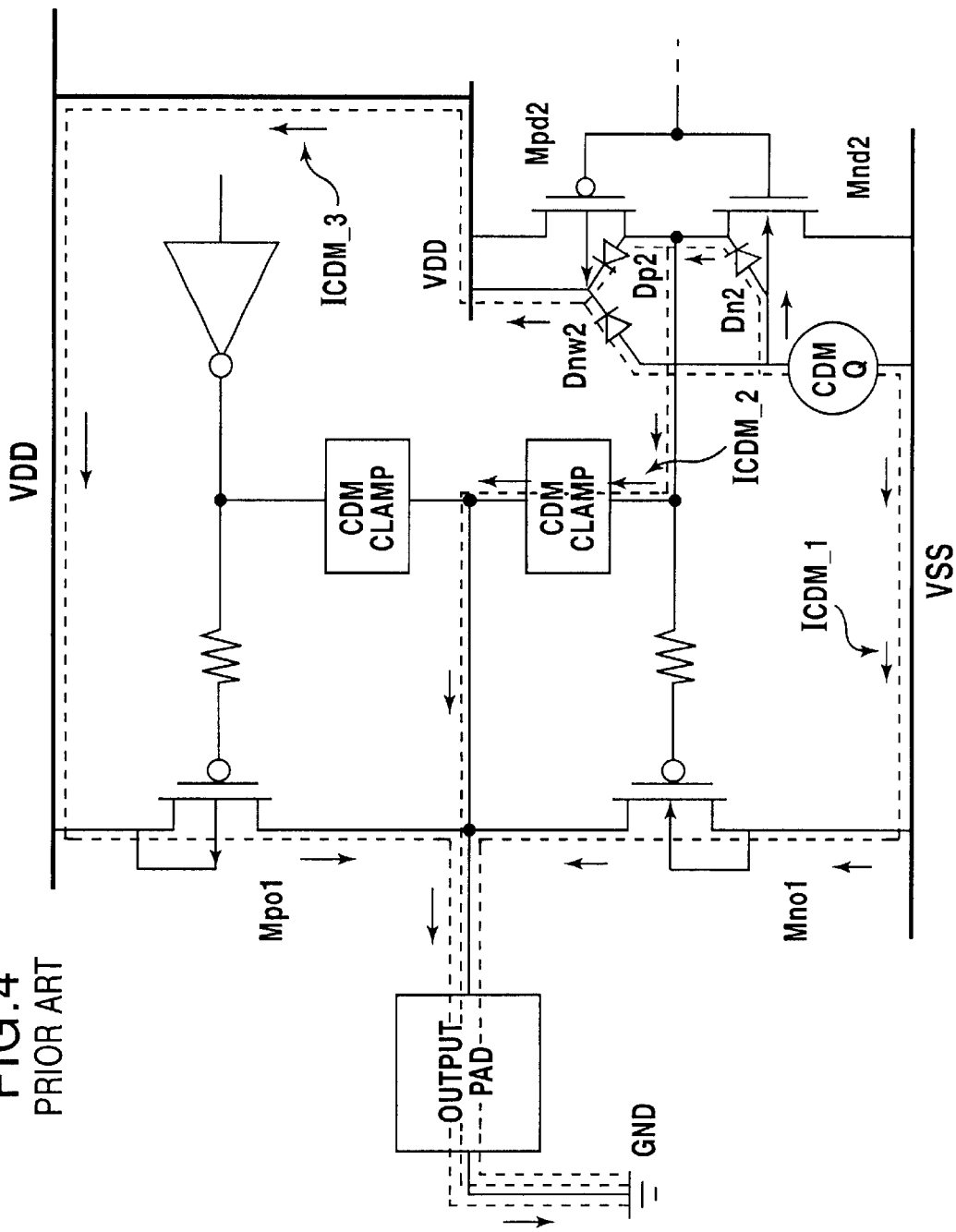
FIG. 4 is a schematic diagram of the conventional CDM ESD protection circuit of FIG. 2.
Figure 5:
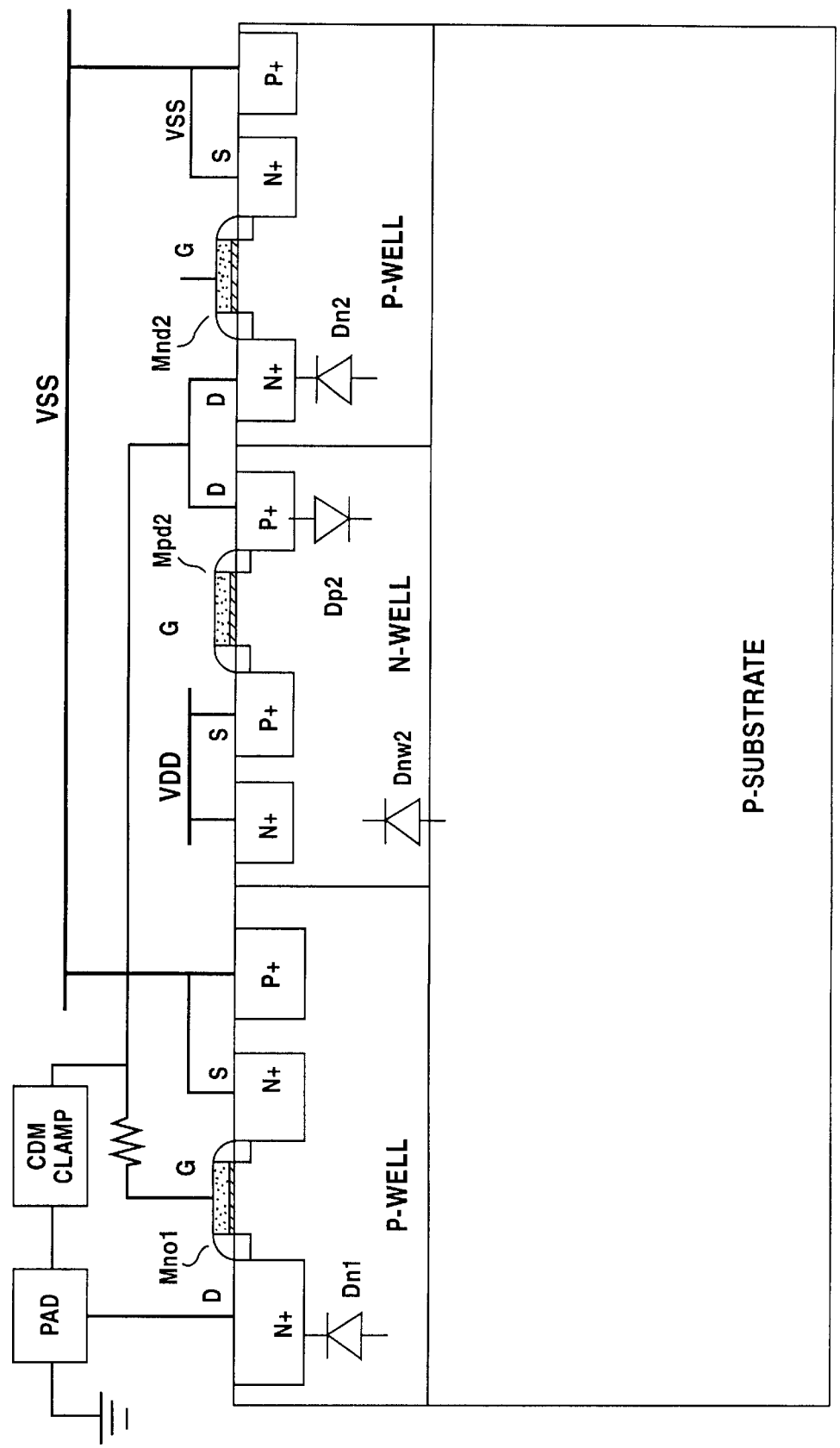
FIG. 5 is a cross-sectional view of the conventional CDM ESD protection circuit of FIG. 2.
Figure 6:
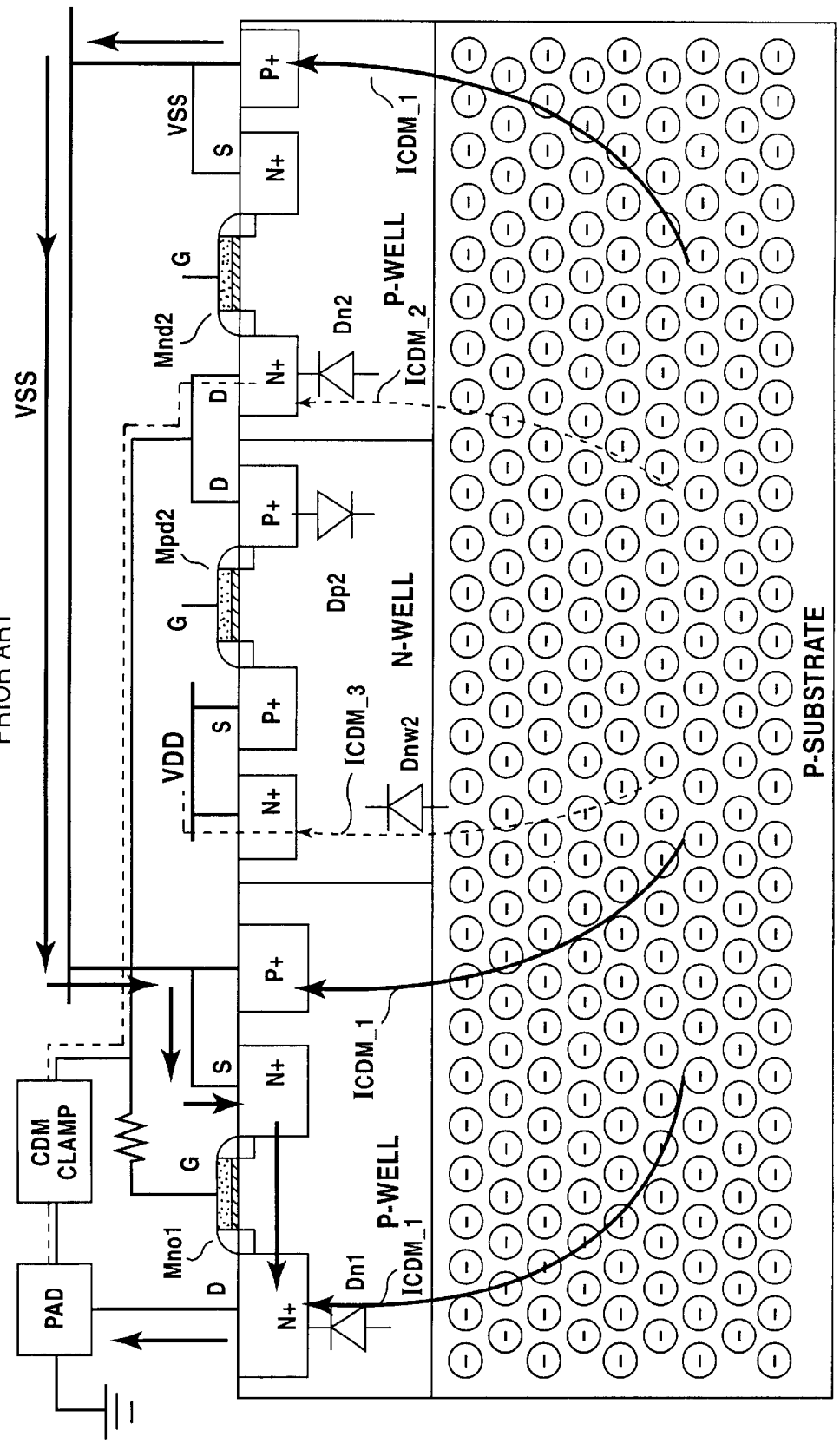
FIG. 6 is an illustrative view of the conventional CDM ESD protection circuit of FIG. 2.
Figure 7:
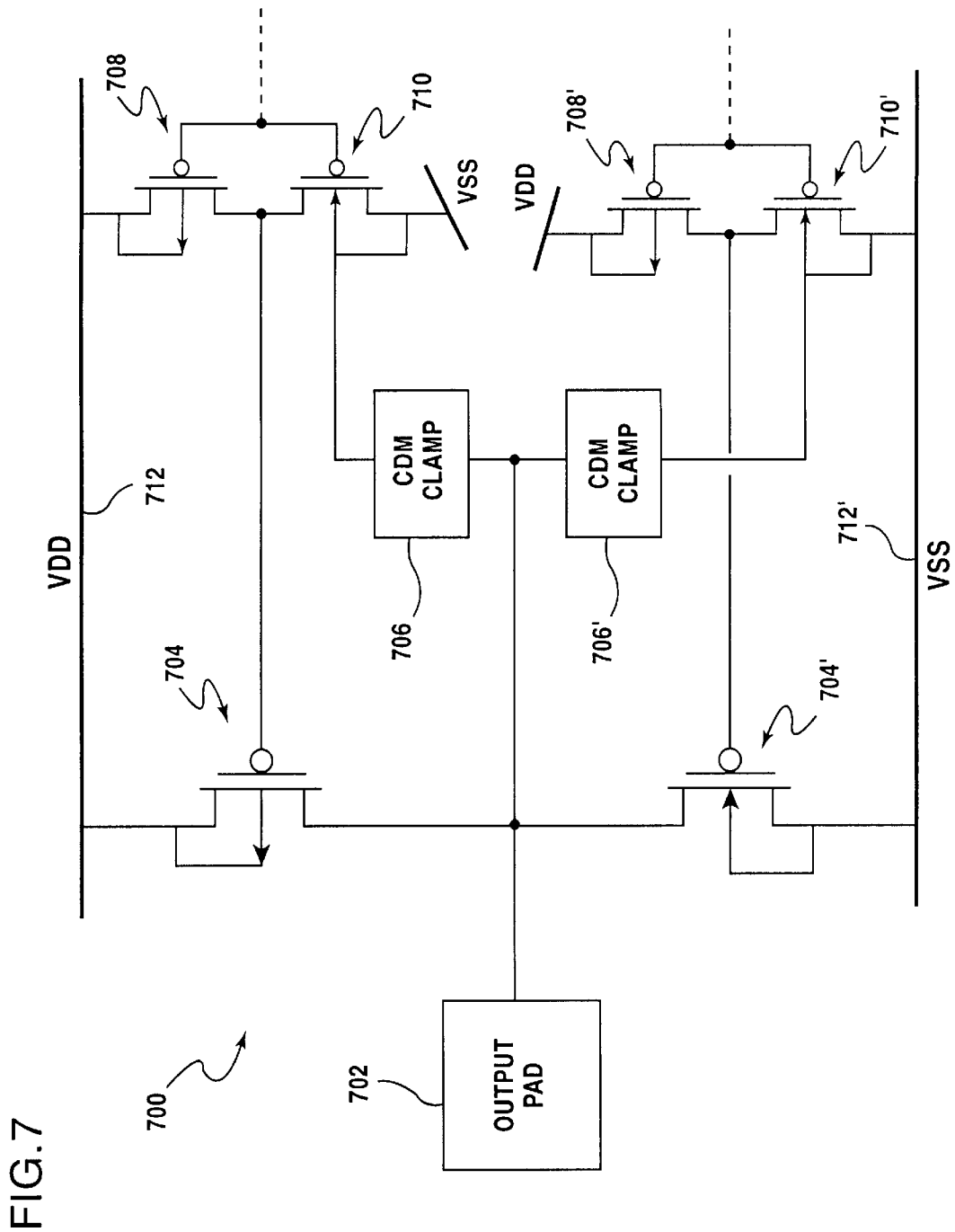
FIG. 7 is a circuit diagram for CDM ESD protection in output buffers with p-type substrate according to one embodiment of the present invention.

One embodiment of the CDM ESD protection circuitry according to the present invention is shown in FIG. 7. The CDM ESD protection circuit 700 on output buffers fabricated with a p-type substrate includes an output pad 702, two MOS transistors 704 and 704', two CDM clamps 706 and 706', and four CMOS transistors 708, 708', 710 and 710'.

VDD and VSS power lines 712 and 712' receive or supply voltage to the integrated circuit during normal event or operation. The output buffers consisting of MOS transistors 704 and 704'have sources respectively connected to the VDD and VSS power lines and drains connected to the output pad 702. The gates of the MOS transistors 704 and 704', which are connected to the drains of the pre-driver inverters consisting of CMOS transistors 708, 708', 710 and 710', respectively, are protected by the CDM clamps 706 and 706' during a CDM ESD event. In particular, the CDM clamps 706 and 706', which are coupled to the output pad 702 and respectively connected to bulks of the CMOS transistors 710 and 710' (i.e., NMOS of pre-driver inverters), allow CDM Q stored in the p-type substrate to flow therethrough instead of flowing through MOS transistors 704 and 704' and causing severe damage to the output buffers.

Figure 8:
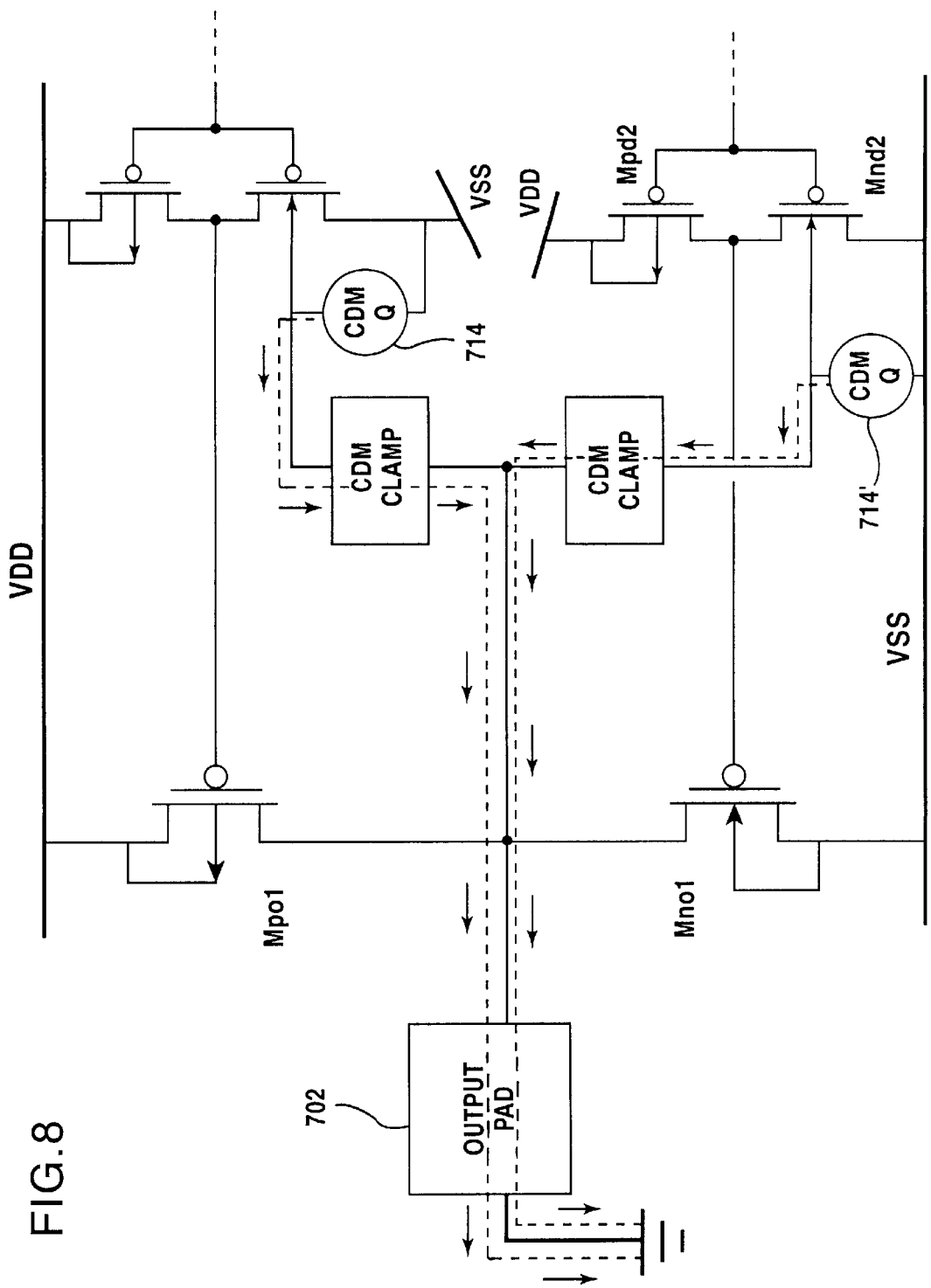
FIG. 8 is an illustrative view of current paths during CDM discharge in the CDM ESD protection circuit as shown in FIG. 7.

In FIG. 8, the dash lines with arrows show the current path in which the discharging current from CDM Q 714 and 714' flows from the p-type substrate to the grounded output pad 702 during a CDM ESD event, even if the CDM Q stored in the p-type substrate has a negative polarity.

Figure 9:
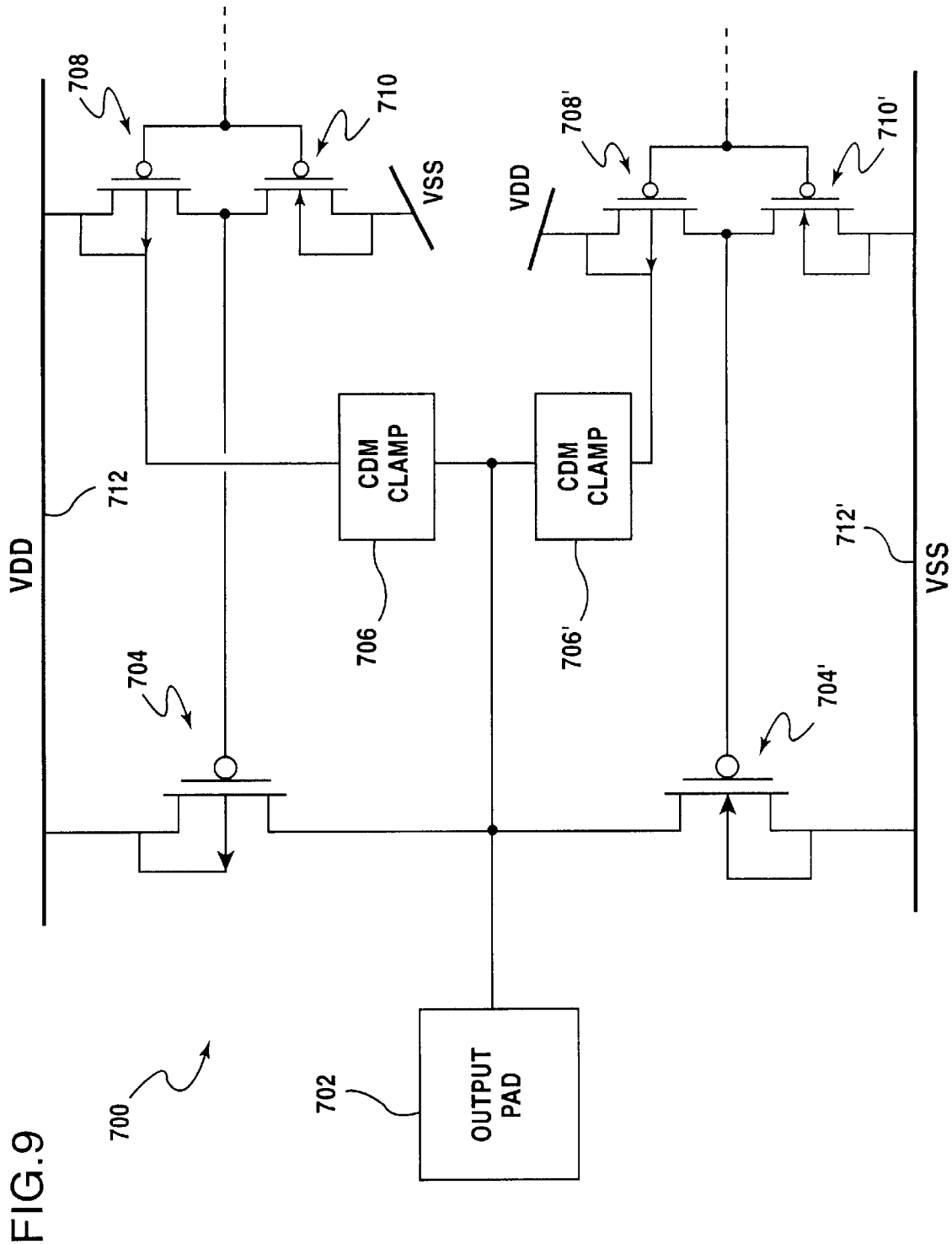
FIG. 9 is a circuit diagram for CDM ESD protection in output buffers with an n-type substrate according to the present invention.

For output buffers fabricated on an n-type substrate, the CDM ESD protection is achieved by connecting the CDM clamps 706 and 706' to respective bulks of the CMOS transistors 708 and 708' (i.e., PMOS of pre-driver inverters), as shown in FIG. 9.

Figure 10:
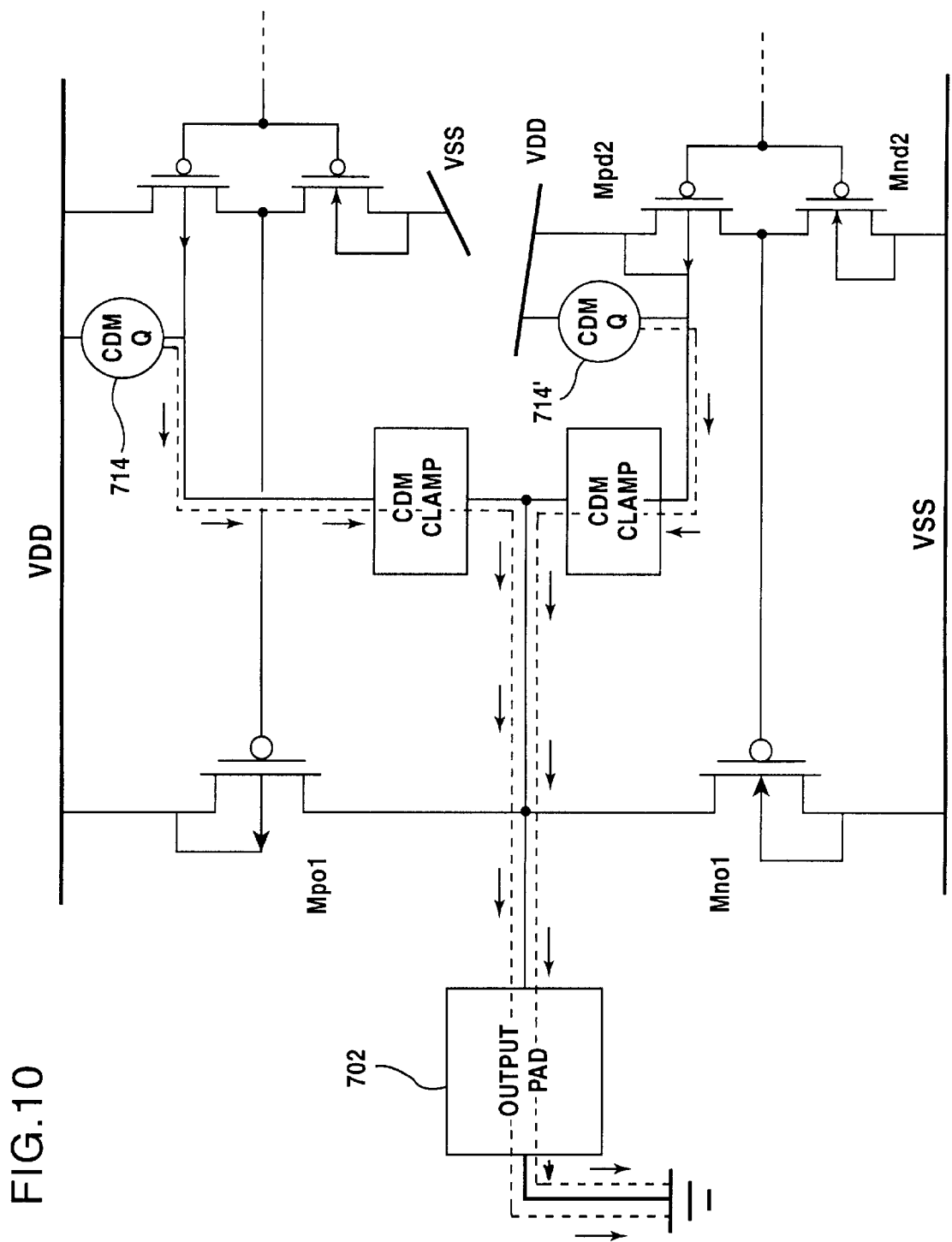
FIG. 10 is an illustrative view of current paths during CDM discharge in the CDM ESD protection circuit as shown in FIG. 9.

The current path of the CDM ESD discharging current during a CDM ESD event is shown in FIG. 10. The dash lines with arrows show the current path in which the discharging current from CDM Q 714 and 714' flows from the n-type substrate to the grounded output pad 702 during a CDM ESD event, even if the CDM charge stored in the n-type substrate has a negative polarity.

Figure 11:
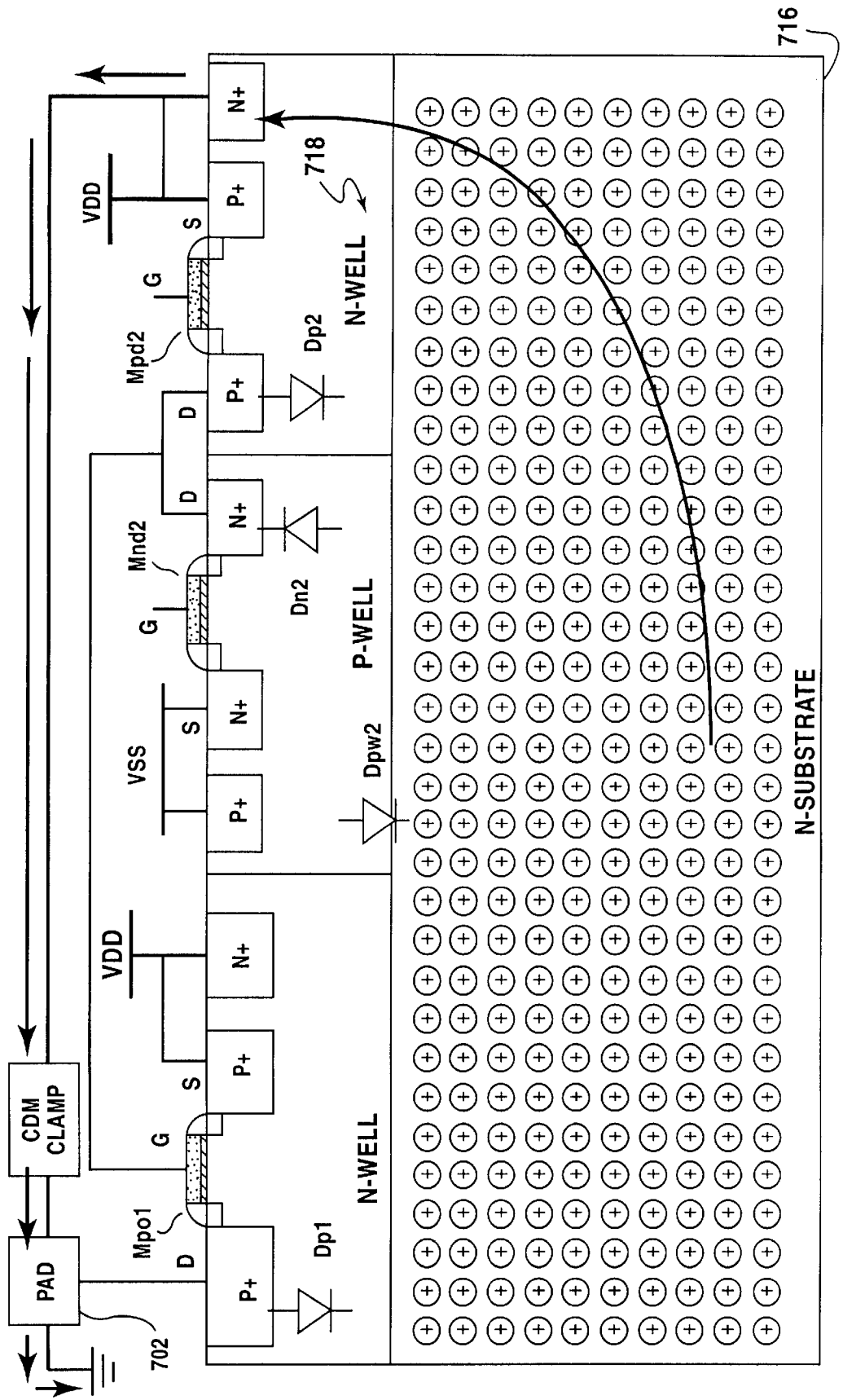
FIG. 11 is an illustrative cross-sectional view of the CDM ESD protection circuit in the n-type substrate.

To more clearly describe the CDM Q stored in the n-type substrate, which are discharged by the CDM clamps 706 and 706', a schematically drawing with the device cross-sectional view is shown in FIG. 11. The positive charges stored in the n-type substrate 716 are directly conducted through the N+ pick-up in the N-well region 718 (N+ diffusion that connected to the N-well/N-type substrate) to the desired CDM clamp, and then discharged through the CDM clamp to the grounded output pad 702. The corresponding discharging path is shown in FIG. 10 with dashed lines.

As such, the CDM ESD protection circuit of the present invention provides direct discharging paths to bypass the CDM ESD current away from the common substrate and to the grounded pad without causing the ESD damage to the output buffers.

Figure 12:
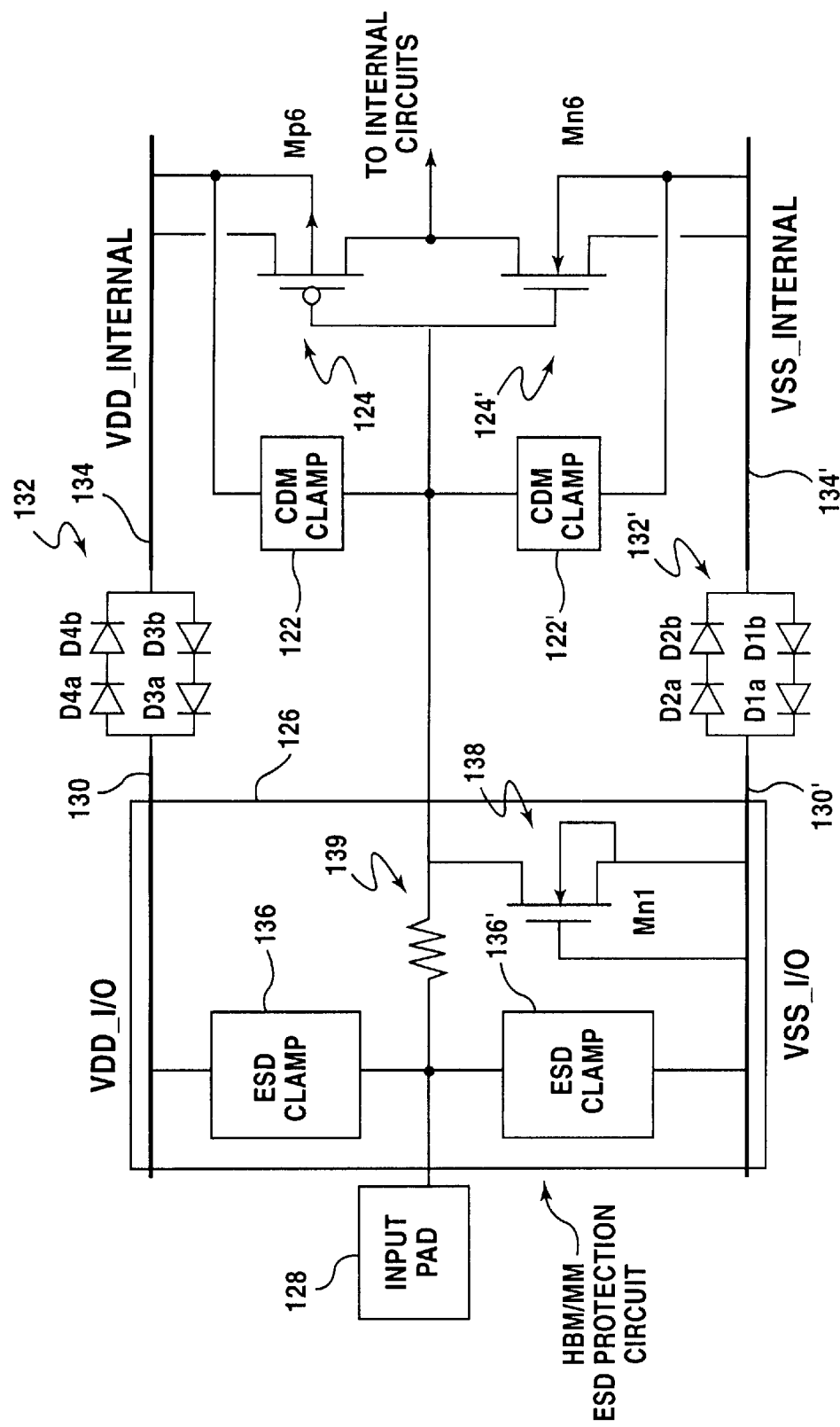
FIG. 12 a circuit diagram of the CDM ESD protection for input circuits according to another embodiment of the present invention.

The CDM ESD protection circuit can be applied to input circuits as shown in FIG. 12. Such embodiment for the input circuit includes a pair of CDM clamps 122 and 122' which are connected to respective bulks of CMOS transistors 124 and 124' (i.e, bulks of PMOS 124 and NMOS 124' of the first input stage). The CDM clamps 122 and 122' effectively clamp the overstress voltage across thinner gate oxides of first input stage during CDM ESD events. Moreover, a Human-Body Model (HBM)/Machine Model (MM) ESD protection circuit 126 is connected to an input pad 128 and disposed between a VDD_I/O power line 130 and a VSS_I/O power line 130'. A first string of bi-directional diodes 132 is disposed between the VDD_I/O power line 130 and a VDD_Internal power line 134, and a second string of bi-directional diodes 132' is disposed between the VSS_I/O power line 130' and a VSS_Internal power line 134'. In particular, the pair of CDM clamps 122 and 122' are disposed between the HBM/MM ESD protection circuit 126 and CMOS transistors 124 and 124', and directly coupled to bulks of respective CMOS transistors 124 and 124'.

In the modem CMOS IC's, the internal circuits (including the first input stage) are often biased with the VDD_internal and VSS_internal power lines, which are separated from the power lines (VDD_I/O and VSS_I/O ) to block the noise coupling between the power lines. With separate power lines, especially the VSS_I/O power line 130' and VSS_internal power line 134' for the CMOS IC's fabricated within the p-type substrate, the input circuits are more susceptible to the CDM ESD events. Accordingly, to further protect the input circuits against damage from CDM ESD events, the bi-directional diode strings 132 and 132' with multiple diodes are disposed between the separated VSS_I/O and VSS_internal power lines 130 and 134, or between the separated VDD_I/O and VDD internal power lines 130' and 134'.

In the HBM/MM CDM ESD protection circuit 126, a pair of ESD clamps 136 and 136' are each coupled to the input pad 128 and disposed between the VDD_I/O power line 130 and VSS_I/O power line 130'. A MOS transistor 138 is coupled between the VSS_I/O power line 130' and a resistor 139, which is connected to the input pad 128 and the ESD clamps 136 and 136'.

Figure 13:
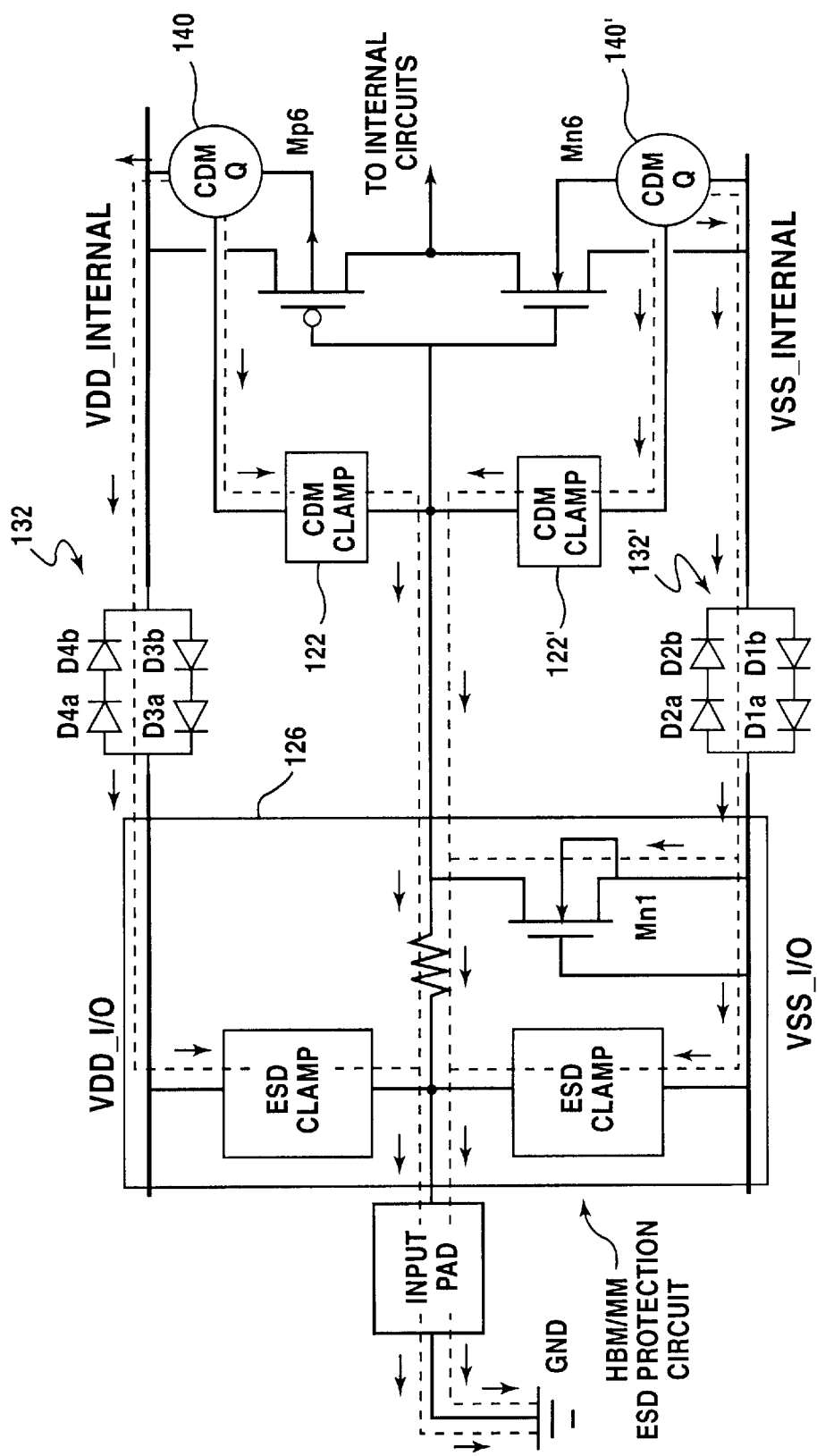
FIG. 13 is an illustrative view of current paths during CDM discharge in the CDM ESD protection circuit as shown in FIG. 12.

The CDM ESD discharging current paths are shown in FIG. 13, which demonstrate the effectiveness of the CDM ESD protection circuitry as shown in FIG. 12. The CDM Qs 140 and 140' originally stored in the common substrate are mainly discharged through the CDM clamps 122 and 122', or through the bi-directional diodes strings 132 and 132' to the HBM/MM ESD protection circuit 126. The diode strings 132 and 132', along with the HBM.MM ESD protection circuit, provide extra current paths to discharge the CDM Qs from the substrate. This increases the CDM ESD level of the input circuits. For an ESD specification that needs a much higher CDM ESD level, it can be achieved by using this CDM ESD protection circuitry on both the input and output circuits.

Figure 14:
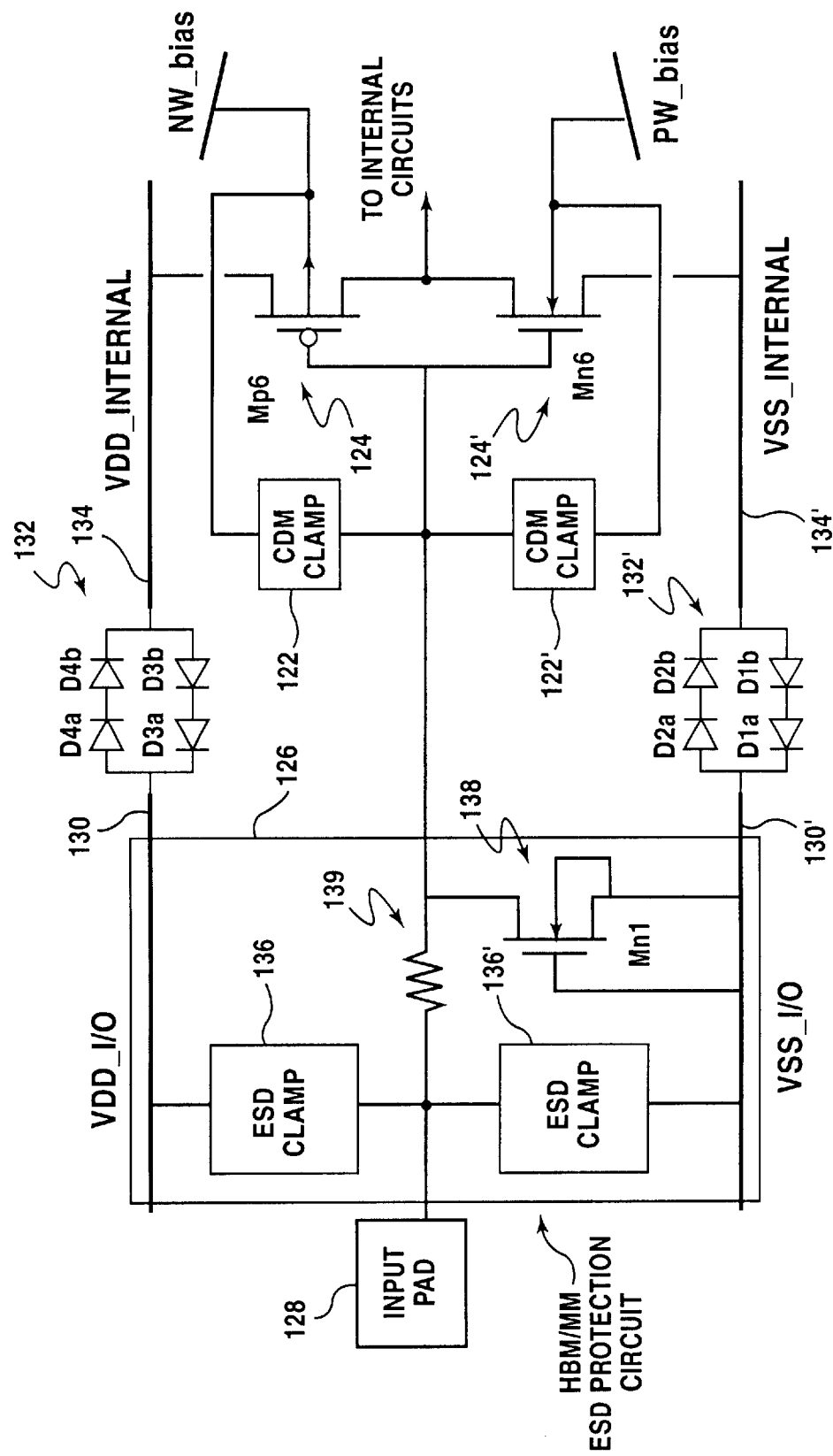
FIG. 14 is a circuit diagram of the CDM ESD protection for N-Well and P-well biased input circuits.

For high-resolution and high-performance consideration, some analog circuits or RF circuits have the clear n-well and p-well biases to avoid the disturbing from the noise. In such CMOS IC's, the n-well or p-well of internal circuits have isolated biases (NW-bias and PW-bias). The CDM ESD protection circuitry can be also applied to protect such input circuits, as shown in FIG. 14. The CDM clamps 122 and 122' are connected to respective bulks (N-well) of the CMOS transistors 124 and 124' (i.e, bulks of PMOS (p-well or PW_bias) and NMOS (n-well or NW_bias), to discharge the CDM Qs stored in the common substrate.

Figure 15:
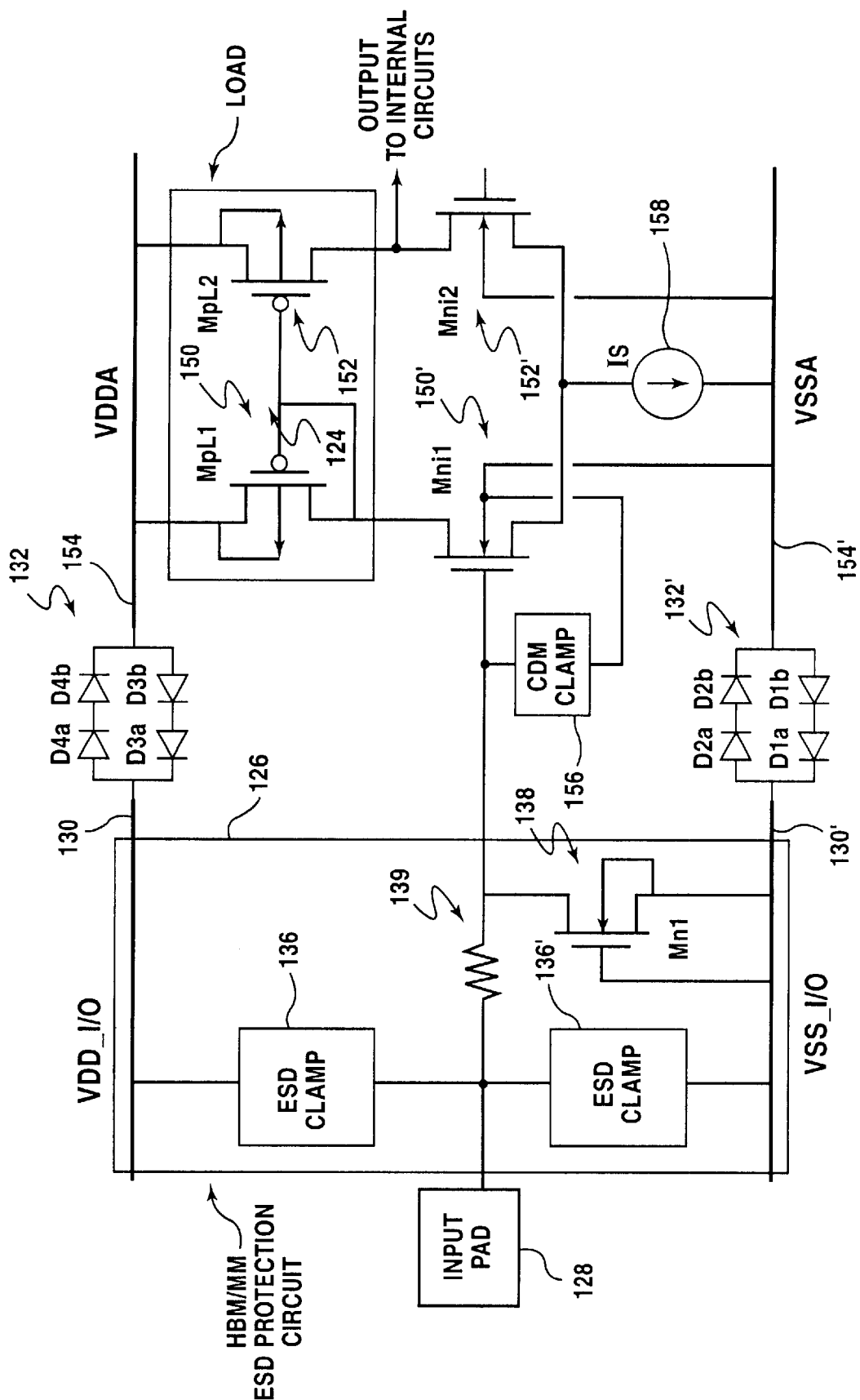
FIG. 15 is a circuit diagram of the CDM ESD protection for analog circuits with different input state.

In some analog circuits with the different input stage, the CDM ESD protection circuit can be applied to protect such different input circuits as shown in FIG. 15. The CDM ESD protection circuit as shown in FIG. 15 includes a first set of CMOS transistors 150 and 150', and a second set of CMOS transistors 152 and 152', that are disposed between the VDDA power line 154 and the VSSA power line 154'. In particular, a CDM clamp 156 is connected to a HBM/MM ESD protection circuit 126 and to a bulk of an input NMOS transistor 150' in the differential input stage to clamp the overstress voltage across the gate oxide of the input NMOS transistor 150'. A current source 158 connected to the VSSA power line 154' provides constant current to CMOS transistors 150' and 152'.

As with the input circuit, the analog circuit also has bi-directional diode strings 132 and 132' with multiple diodes that are disposed between the separated VDD_I/O and VDDA power lines 130 and 154, or between the separated VSS_I/O and VSSA power lines 130' and 154'. The bi-directional strings provide more discharging current paths from the substrate of the analog circuits to improve CDM ESD level of the analog input circuits.

If an additional input NMOS transistor in the differential input stage is directly connected to an input pad 128, then another CDM clamp (not shown) is necessary to be disposed between the gate and the bulk of the additional input NMOS to clamp the overstress voltage across the gate oxide of the additional input NMOS transistor.

The number of diodes connected between the VSS_internal and the VSS_I/O power lines are not limited to that shown in FIGS. 12–15. The diodes connected between the separated power lines (VDD or VSS) can have multiple series diodes. The CDM clamp can also be formed by NMOS or PMOS diodes, or any device that has a breakdown voltage smaller than the breakdown voltage of the gate oxide of the input NMOS or PMOS transistor. Therefore the CDM clamp can limit the overstress voltage of the gate oxide of the input devices, before gate oxide is ruptured by the CDM ESD voltage.

Figure 16:
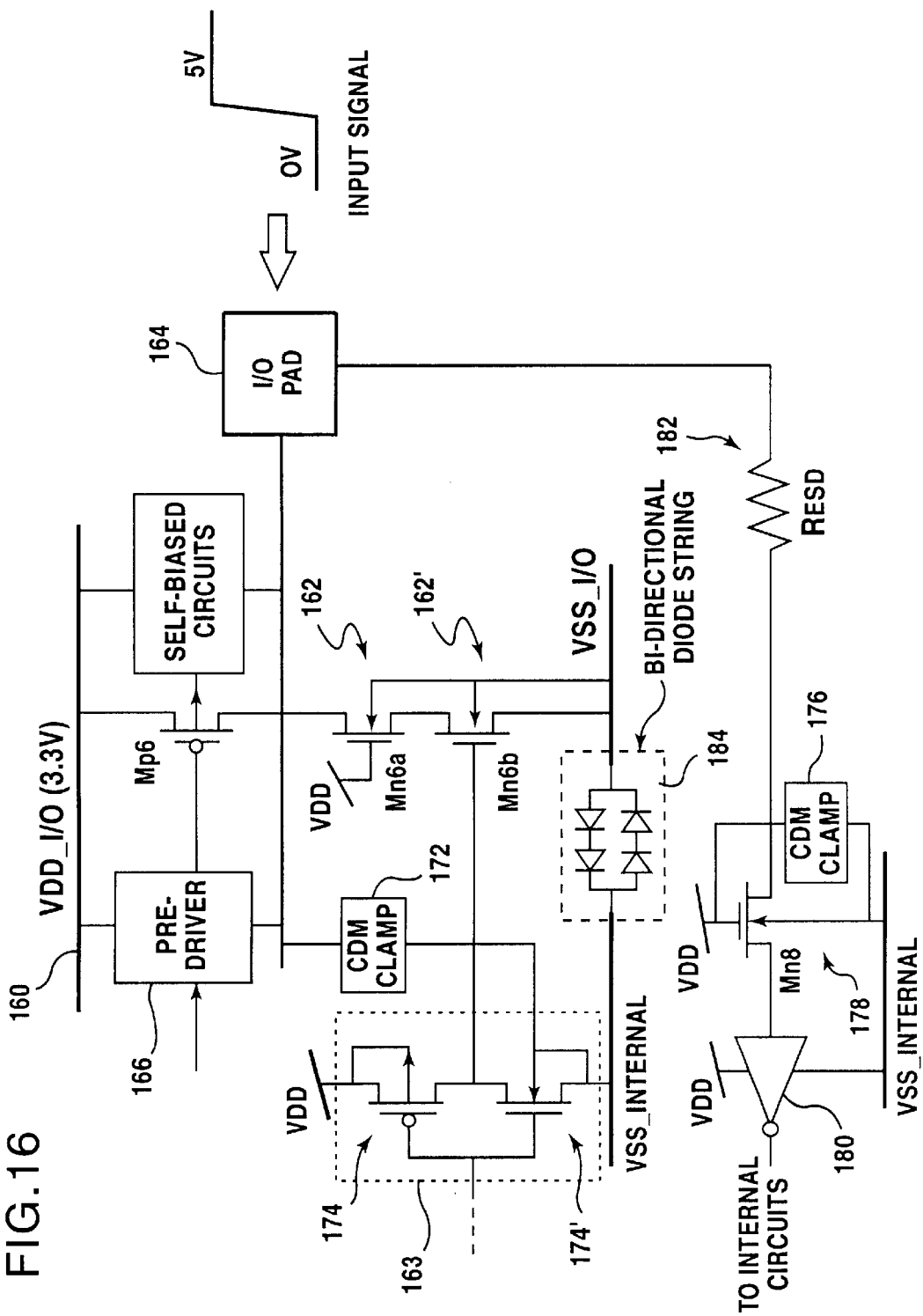
FIG. 16 is a circuit diagram of the CDM ESD protection for high-voltage tolerant I/O circuits according to yet another embodiment of the present invention.

As shown in FIG. 16, the CDM ESD protection circuit can be applied to high-voltage tolerant I/O circuits. A typical 3V/5V-tolerant I/O circuit with the CDM ESD protection circuit is shown in FIG. 16 in which the output PMOS has a self-biased N-well, which is not directly biased at VDD__I/O (3.3V) power line 160. To avoid the voltage overstress on the gate oxide of the 3.3-V device, the output NMOS transistors 162 and 162' have a stacked configuration. The gate-oxides of NMOS transistors 162 and 162' cannot sustained the 5-V voltage stress derived from the input signal at an I/O pad 164 for a long duration. Therefore, the gate of the NMOS transistor 162 is connected to VDD power line 160 at 3.3V, and the gate of NMOS transistor 162' is controlled by a pre-driver inverter 163 in order to avoid the gate-oxide over stressed condition. Such a stacked configuration has been generally used in the high/low-voltage-tolerant I/O circuits. In such a 3V/5V-tolerant I/O circuit, an input signal of 5V may enter into the I/O pad 164. To avoid the direct gate-oxide overstress problem in the first input stage by the 5-V input voltage, there is an NMOS transistor 178 as the transmission gate to block the 5-V input voltage level to the gate oxide of the first input stage. The gate of the NMOS transistor 178 is connected to the VDD power line 160 at 3.3V in the 3V/5V tolerant I/O circuit. Such a 3V/5V-tolerant I/O circuit had been widely used in the deep sub-micron CMOS IC's for mixed-voltage system applications. Similar circuits have also been used in the 3.3V/2.5V/1.8V/1.5V tolerant I/O interface circuits.

Additionally, to improve the CDM ESD level of above-discussed complex high/low-voltage tolerant I/O circuit, a first CDM clamp 172 is disposed between the I/O pad 164 and a pair of CMOS transistors 174 and 174' in which the CDM clamp 172 is directly connected to a bulk of one of the CMOS transistors (i.e., NMOS transistor 174') of the pre-driver inverter 163. Moreover, a second CDM clamp 176 is connected between the gate and bulk of the NMOS transistor 178. The source of the NMOS transistor 178 is connected to an inverter 180 while the drain of the NMOS transistor 178 is connected to the I/O pad 164 via a resistor 182. By coupling a bi-directional diode string 184 with multiple diodes between VSS__Internal and VSS__I/O power lines, the ESD level of the high/low-voltage tolerant I/O circuit can be further improved through an extra current path for discharging the CDM Q stored in the substrate.

Although a specific form of the present invention has been described above and illustrated din the accompanying drawings in order to be more clearly understood, the above description is made by way of example and not as a limitation to the scope of the present invention. It is believed that various modifications apparent to one of ordinary skill in the art could be made without departing from the scope of the present invention which is to be determined by the following claims.

What is claimed is:

1. An output circuit for an integrated circuit device comprising:
   an output pad;
   a first power line for supplying a VDD voltage to said integrated circuit device;
   a MOS transistor disposed between said output pad and said first power line;
   a second power line for supplying a VSS voltage to said integrated circuit device;
   a MOS circuit with CMOS transistors disposed between the first power line and the second power line; and
   a CDM ESD protection circuit disposed between said output pad and said MOS circuit,
   wherein drains of said CMOS transistors are directly coupled to a gate of said MOS transistor, and said CDM ESD protection circuit is directly coupled to a bulk of one of said CMOS transistors.

2. The output circuit according to claim 1, wherein said CDM ESD protection circuit comprises a CDM clamp.

3. The output circuit according to claim 1, wherein said integrated circuit device is formed on a p-type or n-type substrate.

4. The output circuit according to claim 1, wherein said MOS transistor is a PMOS transistor on a p-type or n-type substrate.

5. The output circuit according to claim 1, wherein said one of said CMOS transistors is a NMOS transistor on a p-type substrate, or a PMOS transistor on an n-type substrate.

6. An output circuit for an integrated circuit device comprising:
   an output pad;
   a first power line for supplying a VDD voltage to said integrated circuit device;
   a pair of MOS transistors coupled to said output pad;
   a second power line for supplying a VSS voltage to said integrated circuit device;
   a pair MOS circuits each with a pair of CMOS transistors and disposed between said first power line and said second power line; and
   a pair of CDM ESD protection circuits each disposed between said output pad and each of said MOS circuits,
   wherein drains of said CMOS transistors are directly coupled to respective gates of said MOS transistors, and said CDM ESD protection circuits are directly coupled to respective bulks from both of said CMOS transistors.

7. The output circuit according to claim 6, wherein said CDM ESD protection circuits comprise CDM clamps.

8. The output circuit according to claim 6, wherein said integrated circuit device is formed on a p-type or n-type substrate.

9. The output circuit according to claim 6, wherein said pair of MOS transistors includes a PMOS transistor and an NMOS transistor on a p-type or n-type substrate.

10. The output circuit according to claim 6, wherein said two of said CMOS transistors are NMOS transistors on a p-type substrate, or PMOS transistors on an n-type substrate.

11. An input circuit for an integrated circuit device comprising:
    an input pad;
    a bi-directional diode string disposed between a VDD__I/O power line and a VDD__Internal power line; and
    an CDM ESD protection circuit disposed between said input pad and a MOS transistor,
    wherein said CDM ESD protection circuit is directly coupled to a bulk of said MOS transistor.

12. The input circuit according to claim 11, wherein said CDM ESD protection circuit comprises a CDM clamp.

13. An input circuit for an integrated circuit device comprising:
    an input pad;
    a HBM/MM ESD protection circuit coupled to said input pad and disposed between a VDD__I/O power line and a VSS__I/O power line;
    a first bi-directional diode string disposed between said VDD__I/O power line and a VDD__Internal power line;
    a second bi-directional diode string disposed between said VSS__I/O power line and a VSS__Internal power line; and a pair of CDM ESD protection circuits disposed between said HBM/MM ESD protection circuit and CMOS transistors, wherein said CDM ESD protection circuits are directly coupled to respective bulks of said CMOS transistors.

14. The input circuit according to claim 13, wherein said CDM ESD protection circuits comprise CDM clamps.

15. The input circuit according to claim 13, wherein said HBM/MM ESD protection circuit comprises:

a pair of ESD clamps coupled to said input pad and disposed between said VDD_I/O power line and said VSS_I/O power line;

a MOS transistor coupled to said VSS_I/O power line; and a resistor coupled between said input pad and said MOS transistor.

16. An analog circuit with different input stage for an integrated circuit comprising:

an input pad;

a HBM/MM ESD protection circuit coupled to said input pad and disposed between a VDD_I/O power line and a VSS_I/O power line;

a first bi-directional diode string disposed between said VDD_I/O power line and a VDDA power line;

a second of bi-directional diode string disposed between said VSS_I/O power line and a VSSA power line;

a first and second sets of CMOS transistors disposed between said VDDA power line and said VSSA power line; and a CDM ESD protection circuit disposed between said HBM/MM ESD protection circuit and one of said first set of CMOS transistors, wherein said CDM ESD protection circuit is directly coupled to a bulk of said one of said CMOS transistors of said first set.

17. The analog circuit according to claim 16, wherein said HBM/MM ESD protection circuit further comprises a current source coupled between said VSSA power line and said first and second sets of CMOS transistors.

18. The analog circuit according to claim 16, wherein said HBM/MM ESD protection circuit comprises:

a pair of ESD clamps coupled to said input pad and disposed between said VDD_I/O power line and said VSS_I/O power line;

a MOS transistor coupled to said VSS_I/O power line; and a resistor coupled between said input pad and said MOS transistor.

19. A high-voltage tolerant I/O circuit in an integrated circuit device comprising:

an I/O pad;

CMOS transistors disposed between a VDD power line and a VSS_internal power line;

a CDM ESD protection circuit disposed between said I/O pad and said CMOS transistors, wherein said CDM ESD protection circuit is directly coupled to a bulk of one of said CMOS transistors;

a MOS transistor disposed between said VDD power line and said VSS_Internal power line; and an additional CDM ESD protection circuit connected between a bulk of said MOS transistor and a VDD power line, wherein a source of said MOS transistor is connected to an inverter, a gate of said MOS transistor is connected to said I/O pad via a resistor.

20. The high-voltage tolerant I/O circuit according to claim 19, further comprising a bi-directional diode string coupled between said VSS_Internal power line and a VSS_I/O power line.

* * * * *